United States Patent [19]

DeFreitas et al.

[11] Patent Number: 4,682,362

[45] Date of Patent: Jul. 21, 1987

[54] GENERATING NARROWLY-SEPARATED VARIABLE-FREQUENCY CLOCK SIGNALS

[75] Inventors: Richard E. DeFreitas, North Chelmsford; Daniel T. Sullivan, Bolton, both of Mass.

[73] Assignee: Analog and Digital Systems, Inc., Wilmington, Mass.

[21] Appl. No.: 779,785

[22] Filed: Sep. 24, 1985

[51] Int. Cl.[4] ........................................ H03L 7/16

[52] U.S. Cl. ........................ 381/61; 84/DIG. 4; 331/10; 328/63; 328/72; 328/109; 307/522; 307/269; 307/271

[58] Field of Search .................. 331/10; 381/63, 61, 381/62; 84/1.24, DIG. 4, 1.01; 307/269, 271, 511, 522; 328/62, 63, 72, 109, 21

[56] References Cited

U.S. PATENT DOCUMENTS

| | | | |
|---|---|---|---|
| 4,389,915 | 6/1983 | Bione | 84/1.01 |
| 4,392,405 | 7/1983 | Franz et al. | 84/1.24 |
| 4,511,858 | 4/1985 | Charavit et al. | 331/10 |
| 4,569,268 | 2/1986 | Futamase et al. | 84/1.24 |

OTHER PUBLICATIONS

RCA Integrated Circuits, 1976, pp. 465–469.

*Primary Examiner*—Forester W. Isen

[57] ABSTRACT

Generating clock signals of slightly different frequencies without the signals locking up in synchrony, by providing a voltage-to-frequency converter driven by the output of an integrator, which is supplied with a signal representative of the sum of a frequency-difference command and the difference in frequency between the two clocks.

4 Claims, 5 Drawing Figures

FIG I

GENERATING NARROWLY-SEPARATED VARIABLE-FREQUENCY CLOCK SIGNALS

BACKGROUND OF THE INVENTION

This invention relates to generating clock signals in digital circuits. In applications requiring the generation of clock signals of slightly different and varying frequencies, there can be a tendency for the circuits generating the clock signals to influence one another such that the generated clock signals "lock up", i.e., become synchronous.

SUMMARY OF THE INVENTION

In general the invention features circuitry for generating clock signals of slightly different frequencies without the signals locking up in synchrony. At least one of the clocks has a variable frequency provided by a voltage-to-frequency converter (or its equivalent) driven by the output of an integrator, which is supplied with the sum of a frequency-difference-command signal (e.g., supplied by a supervising microprocessor) and a difference signal representative of the actual difference in frequency between the two clocks. The integrator prevents the two clocks from remaining locked in synchrony if a difference in frequency is being commanded. In preferred embodiments, the circuitry is used to control the clocks in a system for providing variable delay of an audio signal. The invention has the advantage of allowing use of very inexpensive circuits and components (e.g., a simple oscillator may be used for one clock).

DESCRIPTION OF A PREFERRED EMBODIMENT

Drawings

Circuitry

Figure 1:
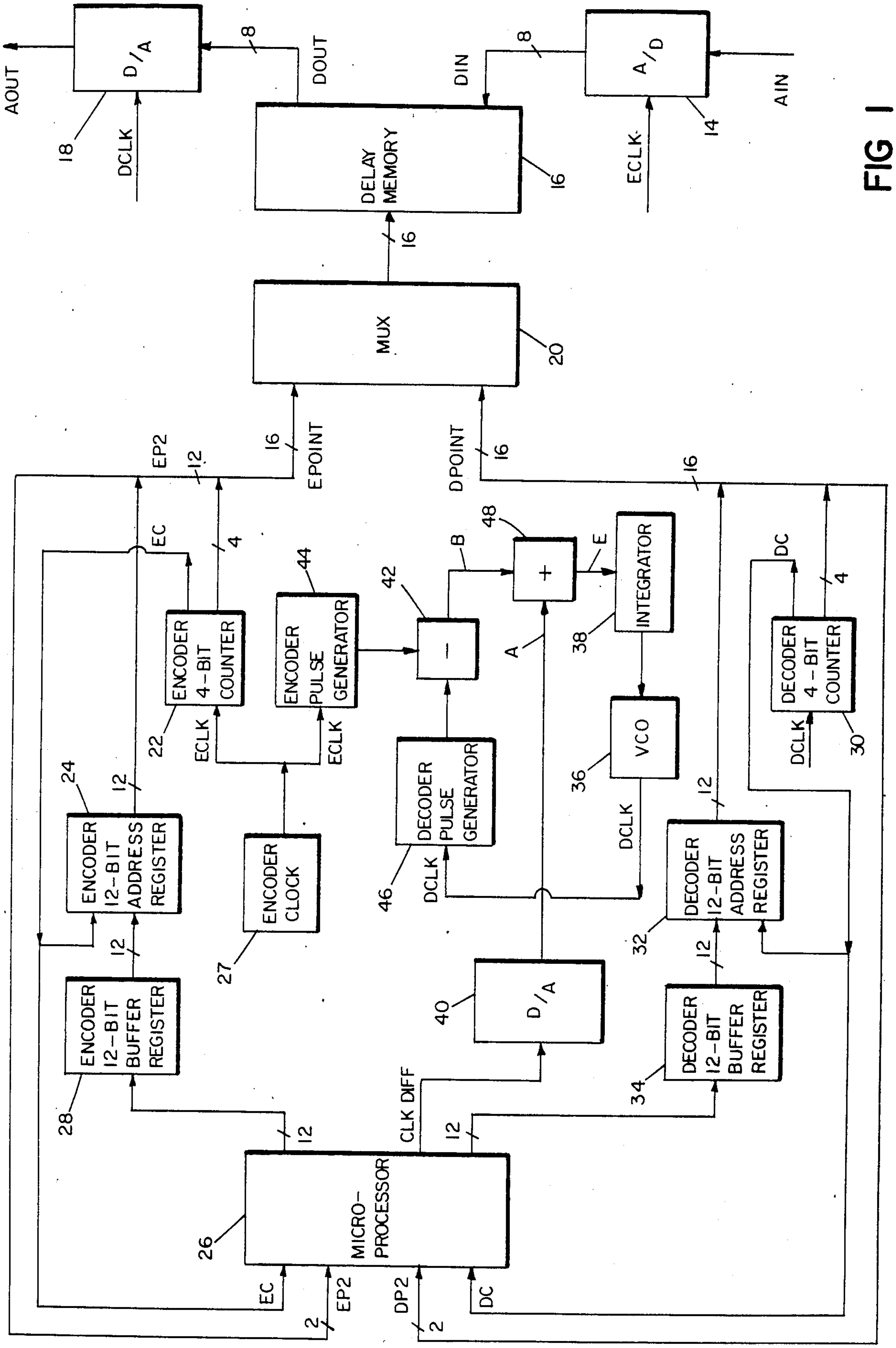
FIG. 1 is a block diagram of a preferred embodiment of the invention.

Referring to FIG. 1, adaptive delta encoder 14 encodes analog input signal AIN to produce digital signal DIN, which is written into delay memory 16 (a 64K byte RAM) at the 16-bit address specified by the encoding pointer EPOINT. Analog output signal AOUT is generated by adaptive delta decoder 18, using digital output signal DOUT, which is read from memory 16 at the 16-bit address specified by the decoding pointer DPOINT. Multiplexer 20 alternately connects DPOINT and EPOINT to the address input of memory 16.

Analog output signal AOUT may be summed with input signal AIN (by circuitry not shown) to produce a flange effect, or it may be used directly.

The encoding pointer EPOINT consists of four low order bits supplied by 4-bit hardware counter 22 and twelve high order bits supplied by 12-bit encoder address register 24. Counter 22 is incremented approximately every 33 microseconds by encoding clock ECLK, supplied by encoding clock circuit 26, consisting of a simple 300 KHz oscillator circuit. Address register 24 is updated every sixteen clock intervals (roughly 500 microseconds) by microprocessor 26 (a conventional 6803 microprocessor) via buffer register 28. When counter 22 overflows, it sends a carry signal EC to address register 24 and microprocessor 26, thereby instructing the address register to load the contents of buffer register 28, which the microprocessor has supplied with the next 12-bit address (ordinarily one bit higher than the last address). The microprocessor has roughly 500 microseconds following receipt of the counter overflow signal EC to supply the buffer register 28 with the next 12-bit address. Providing such a lengthy period makes it possible to use a slow (and inexpensive) microprocessor. The two high order bits of counter 22 are returned to the microprocessor as signal EP2.

Decoding pointer DPOINT is generated in a manner similar to that used to generate the encoding pointer. The low-order four bits of DPOINT are supplied by decoder counter 30; the twelve high order bits, by address register 32. Counter 30 is incremented by decoding clock DCLK, which is generated by voltage-to-frequency converter 36 (see below). Address register 32 is updated by microprocessor 26 via buffer register 34. Overflow line DC from counter 30 is used to instruct address register 32 to load the contents of buffer register 34, and to inform microprocessor 26 that it must reload the buffer register. The two high order bits of counter 30 are returned to the microprocessor as signal DP2.

The frequency of decoding clock DCLK is set by voltage to frequency converter 36, which is driven by the output of integrator 38. The input to the integrator is the sum of signal A, the output of D/A converter 40, and signal B, the output of difference circuit 42. Microprocessor 26 drives the D/A converter, and thus directly establishes the level of signal A. Signal B is a voltage proportional to the difference in frequency of the encoding and decoding clocks; it is generated by difference circuit 42 working in conjunction with pulse generators 44, 46.

Operation

Figure 3:
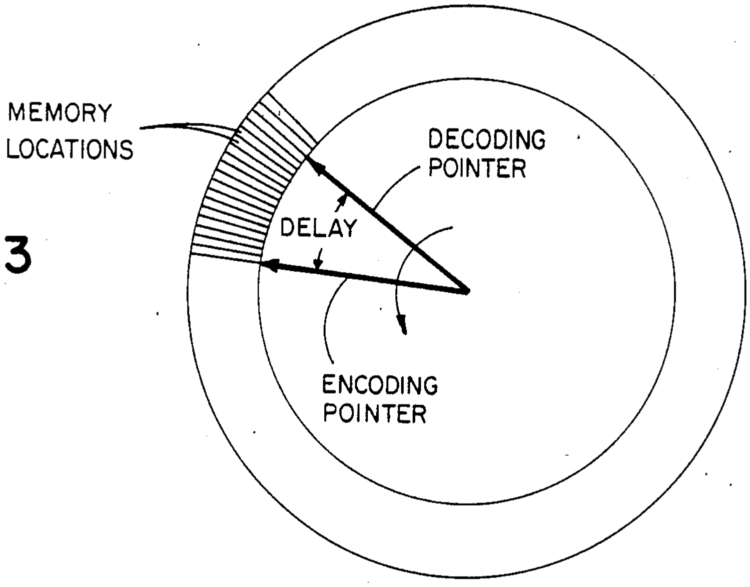
FIG. 3 is a diagrammatic representation of the delay memory of said preferred embodiment.

Operation of the preferred embodiment can be understood by examining FIG. 3, in which memory 16 is shown as a ring of memory locations. Data is written into memory at the address specified by encoding pointer EPOINT, which travels fully around the 64K bits of the memory approximately every 1.7 seconds. Data is read from the memory at the address specified by decoding pointer DPOINT, which trails behind EPOINT by the amount of delay. The speed of the encoding pointer is set by fixed encoding clock ECLK, and is constant (except for drift in the oscillator frequency). Changes in delay are brought about by slightly varying (by a few percent) the decoding clock DCLK relative to the encoding clock ECLK, under control of the microprocessor. For example, a slight slowing down of DCLK will lengthen the delay by causing DPOINT to fall further behind EPOINT.

The microprocessor prescribes the variation between the encoding and decoding clocks using the CLKDIFF signal supplied to A/D converter 40. The CLKDIFF signal prescribes the difference in frequency between the DCLK and ECLK, i.e., the rate of change of the difference in position between the encoding and decoding pointers (as opposed to the actual position of the pointers). During an initialization routine, the microprocessor varies CLKDIFF to find the value that produces the minimum difference between DCLK and ECLK; that value is stored as the zero reference. The CLKDIFF signal is kept at the zero reference whenever the amount of delay is to remain unchanged. A change in delay is brought about by varying CLKDIFF from the zero reference for some interval. The use of an initializing routine to find a zero reference allows the use of imprecise (and thus less expensive) circuits for the D/A converter 40, integrator 38, pulse generator circuits 44, 46, and difference circuit 42. For example, the integrator may have an offset built into its output. Also, the oscillator circuit forming the encoding clock 26 may drift over time as much as 5 to 10% without ill effect. The pulse generator circuits may generate pulses of different widths, so long as the difference remains constant with time and temperature.

Figure 4:
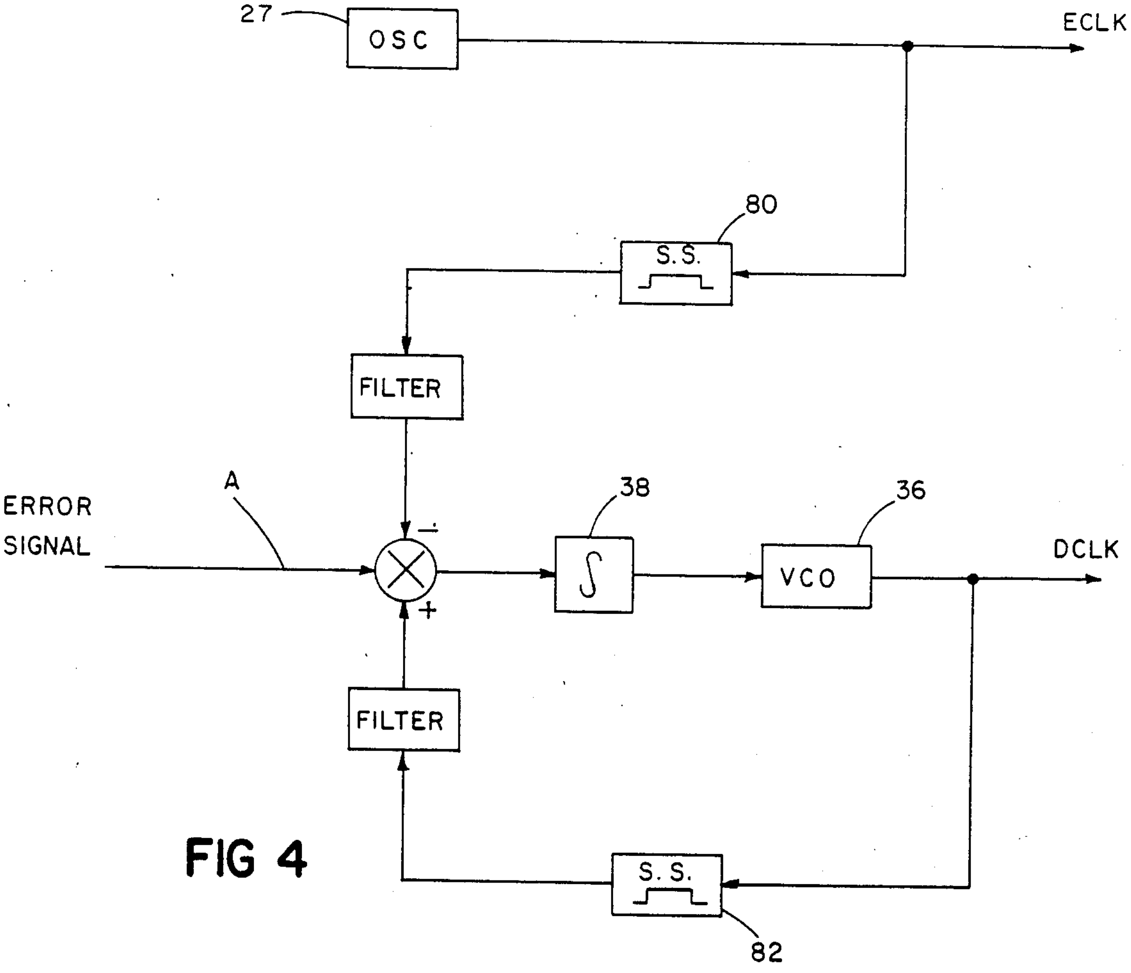
FIG. 4 is a block diagram of the difference and summing circuitry and the integrator shown in FIG. 1.
Figure 5:
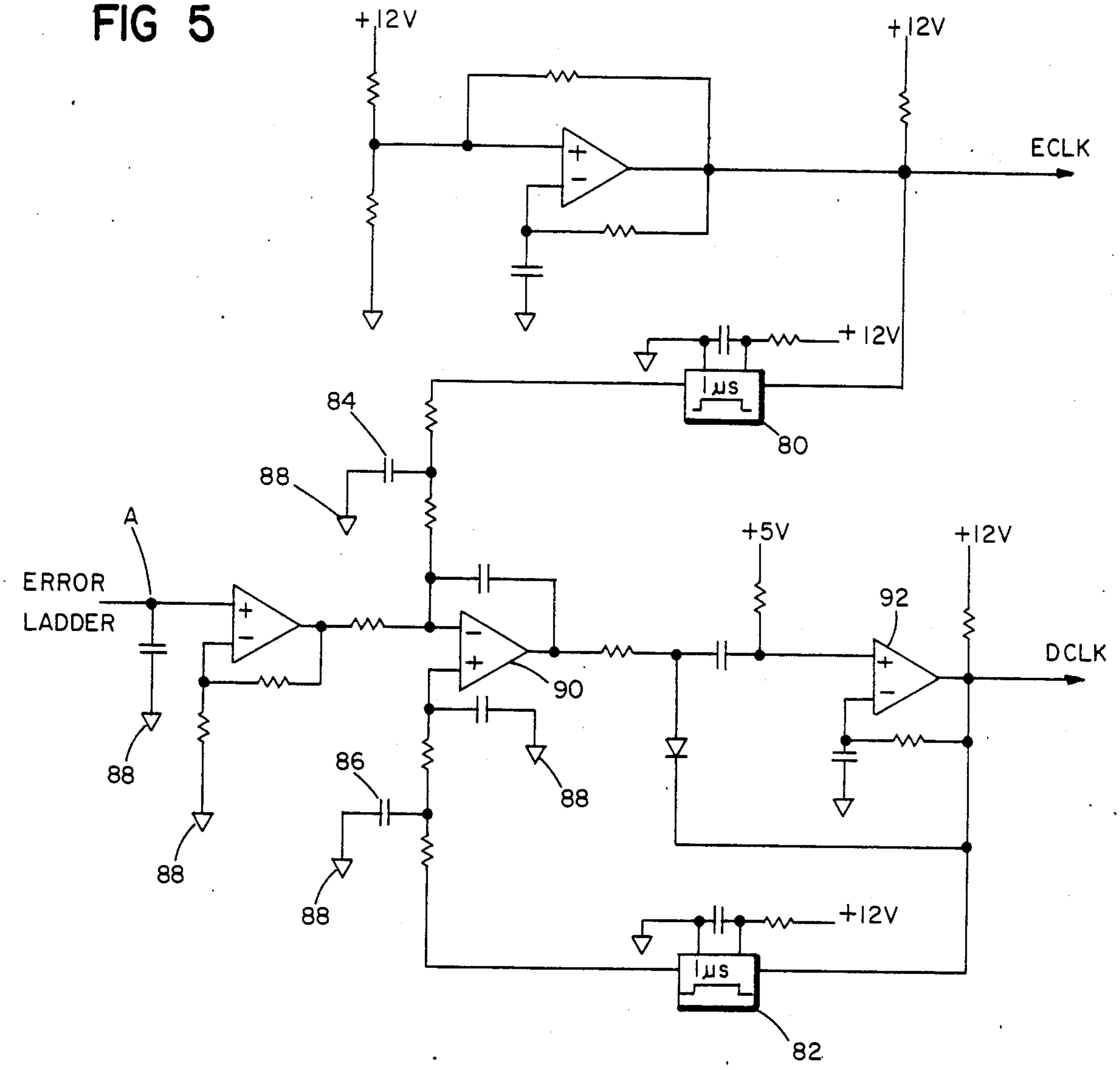
FIG. 5 is a schematic of the preferred implementation of the block diagram of FIG. 4.

A more exact description of the difference circuit 42, summing node 48, integrator 38, pulse generator circuits 44, and voltage-to-frequency converter 36 is given in FIGS. 4 and 5. The difference circuit and summing node are implemented at the input to the same operational amplifier 90 that provides the integration. A comparator 92 and surrounding circuit provides the voltage-to-frequency converter. Referring to FIG. 5, pulse generator circuits 44 are implemented as one-shot pulse generating circuits 80, 82 (implemented as halves of a single dual integrated circuit, each with precision external resistor and capacitor) and filters provided by capacitors 84, 86. The pulse trains generated by the one-shot circuits are filtered to provide an analog voltage representative of the frequency of ECLK and DCLK. The output of D/A converter 40 (more precisely the output of the resistor ladder of the converter) is presented at point A. To minimize noise effects, it is important that all ground connections 88 be separately brought to a common ground node (without intermediate trees or branches).

Figure 2:
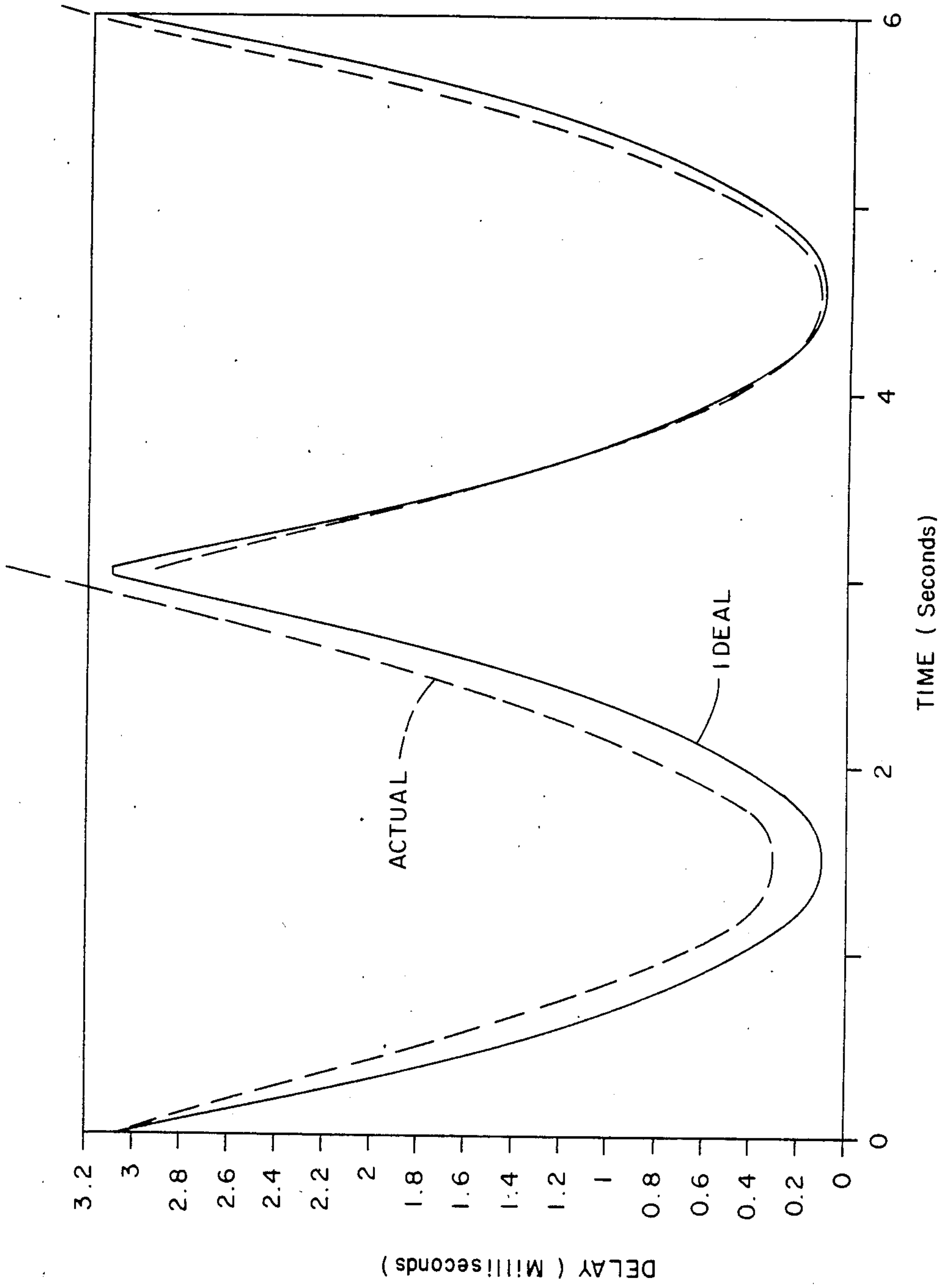
FIG. 2 is a plot illustrating a parabolic flange generated by said embodiment.

To create a flange effect, such as the parabolic flange shown in FIG. 2 (in which delay varies from about 3.0 milliseconds to a minimum of about 100 microseconds, and back to 3.0 milliseconds, roughly every three seconds), the CLKDIFF signal is varied over time according to a predetermined schedule. CLKDIFF is a maximum at the beginning and end of each cycle, at which times the slope of the delay curve in FIG. 2 is a maximum; CLKDIFF is a minimum at the middle of each cycle when the slope of the delay curve is at a minimum.

Because the shape of the delay curve is produced in an open loop manner—i.e., by specifying a schedule of changes in decoding clock frequency over time—the actual delay curve generated tends to vary somewhat randomly from that shown in FIG. 2. In particular the downward and upward halves of the parabolic curve in FIG. 2 may in practice not be perfectly symmetrical. For example, the curve may end up with the shape shown in dashed lines. The microprocessor has a routine for detecting the variation in the turning point of the flange (the closest approach to zero delay) from the desired turning point, and for varying the starting point to minimize the variation. In the example shown, the microprocessor would, after detecting that the actual delay variation was as shown in dashed lines, reduce the starting delay by about 200 microseconds to bring the turning point closer to the desired 100 microseconds from the roughly 300 microseconds achieved in the prior cycle. The result of this adjustment from cycle to cycle is a pleasant sounding randomness in the degree of flanging.

The schedule for varying CLKDIFF is determined by the microprocessor using the measured zero reference and the desired degree of delay variation (set at the control panel). An iterative procedure is followed in which changes to CLKDIFF are made over time, the resulting change in delay is calculated (assuming an ideal D/A converter and integrator), and the schedule of changes to CLKDIFF is altered until the desired delay changes are achieved.

During a flange cycle, the microprocessor monitors the delay between the two pointers EPOINT and DPOINT to assure that the delay never becomes so small as to allow the pointers to crossover, i.e., for the decoding pointer DPOINT to get ahead of the encoding printer. If such an event took place, the decoded signal would instantaneously go from zero delay to approximately 1.7 seconds delay, something generally undesirable because of the musical discontinuity produced. For monitoring the separation between the two pointers, the microprocessor has available to it all but the lowest order two bits of the pointer addresses. If the microprocessor determines that a crossover is about to occur, it immediately alters the CLKDIFF signal sufficiently to slow down the decoding pointer and prevent crossover.

Variation in CLKDIFF brings about a change in the decoding clock DCLK by means of a feedback circuit. When CLKDIFF changes, output A of D/A converter 40 changes, thereby changing the input to integrator 38. The output of integrator 38 then begins to change, bringing about a change in DCLK, thereby, in turn, changing output B of difference circuit 42. Eventually, if no further change is made to CLKDIFF, a new equilibrium point will be reached in which DCLK is changed sufficiently to exactly balance the change in CLKDIFF, at which time the input to the integrator will have returned to zero.

This feedback arrangement prevents the encoding and decoding clocks from "locking up" with one another even when they are operating at only slightly different frequencies. Without the feedback—e.g., if the decoding clock was set directly by the CLKDIFF signal from the microprocessor—noise generated at the instant that one clock changed state would tend to cause the other clock to change state ahead of its prescribed time, thereby locking the two clocks in synchrony. The feedback circuit prevents this from happening, because if such a lock up begins the input to integrator 38 will remain constant, thereby causing the integrator output to grow until the clocks are forced out of synchrony.

The preferred embodiment may also be used to produce what are known in the music industry as "repeats". In this mode of operation, a panel switch (e.g., a button) is used by the operator to initiate storage of 1.7 seconds and music. The microprocessor saves the 0.2 seconds of music preceding depression of the panel switch and the following 1.5 seconds. After this 1.7 seconds and music has been stored in the memory, the decoding pointer DPOINT can be made to move around the memory in a variety of ways to allow any portion of the recorded 1.7 second interval to be repeated. For example, using panel controls the operator may move the starting point of the repeated sequence to the 0.1 second mark (i.e., 0.1 seconds before he depressed the panel switch) and the ending point to the 1.5 second mark. To accomplish this, the microprocessor causes the decoding pointer to skip from the address corresponding to 1.5 seconds immediately to the address corresponding to 0.1 seconds, leaving out the intervening 0.3 seconds of music.

Typically, the operator will set either the beginning or end of the interval to capture a desired sound, and then vary the other boundary until a point is found at which the wrap-around transition (in the example, the jump from the 1.5 second point ot the 0.1 second point) produces an acceptably minimal "click" in the sound. The invention works particularly well in this application because it allows the operator to vary the starting and stopping points of the repeated sound without introducing any sound artifacts (e.g., "clicks") other than the one inherent in the wrap-around transition itself.

In applications in which the delay is not varied, the encoding clock ECLK may be switched into use for both the encoding and decoding pointers.

As the amount of delay is controlled by a microprocessor, it is possible to program a sequence of different delay effects (e.g., a parabolic flange, followed by an echo (i.e., a constant delay), followed by a less pronounced parabolic flange, and so on). Front panel controls (not shown) may be provided for such programming. Because the amount of delay can be instantaneously varied from nearly zero to 1.7 seconds, it is possible to switch between effects without introducing "clicks" or other artifacts (other than those produced solely by the prescribed changes in delay).

Other embodiments of the invention are within the scope of the following claims.

What is claimed is:

1. Circuitry for generating clock signals of slightly different frequencies, said circuitry comprising an oscillator for generating a first clock signal, a voltage-to-frequency converter means for generating a second clock signal, comparison means for comparing the frequencies of said first and second clock signals and generating a difference signal representative of the difference in frequency between said signals, summing means for summing said difference signal and a frequency-difference-command signal (e.g., CLKDIFF), integrating means for integrating the output of said summing means to provide an integrator output, and means for driving said voltage-to-frequency converter means with said integrator output, whereby the frequency of said second clock is forced to approach the frequency of said first clock plus the frequency difference prescribed by said frequency-difference-command signal.

2. The circuitry of claim 1 wherein said first clock is an encoding clock and said second clock is a decoding clock, and wherein said circuitry forms part of a system for variably delaying an audio signal, said system comprising memory means for storing a sequence of numbers comprising digital representions of consecutive portions of said audio signal, addressing means for generating encoding and decoding pointers for accessing said memory means, memory writing means for writing said numbers at sequential memory locations prescribed by said encoding pointer, memory reading means for reading numbers from said memory at sequential locations prescribed by said decoding pointer, said addressing means including means for incrementing said encoding pointer in response to said encoding clock and for incrementing said decoding pointer in response to said decoding clock, and for shifting said encoding and decoding pointers to a predetermined low address in said memory (e.g., the zero address) after a predetermined higher address (e.g., the highest address) is reached, whereby said frequency-difference-command signal prescribes the rate at which said encoding and decoding pointers diverge or converge and thereby the amount of delay of said audio signal.

3. The circuitry of claim 2 further comprising means for prescribing a programmed variation of said frequency-difference-command signal to create a variation in delay useful for providing a flange effect.

4. The circuitry of claim 1 wherein said comparison means comprises first and second one-shot-pulse generators receiving said first and second clock signal, respectively, and first and second filter means for filtering the outputs of said pulse generators.

* * * * *